(12) United States Patent
Endo et al.

(10) Patent No.: US 9,341,650 B2
(45) Date of Patent: May 17, 2016

(54) SPACE TRANSFORMER HAVING A CERAMIC SUBSTRATE WITH A WIRING PATTERN FOR USE IN A PROBE CARD

(71) Applicant: NHK Spring Co., Ltd., Yokohama-shi (JP)

(72) Inventors: Naoki Endo, Kanagawa (JP); Noriyoshi Kaneda, Kanagawa (JP); Shinya Miyaji, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 63 days.

(21) Appl. No.: 14/373,229

(22) PCT Filed: Jan. 15, 2013

(86) PCT No.: PCT/JP2013/050593
§ 371 (c)(1),
(2) Date: Jul. 18, 2014

(87) PCT Pub. No.: WO2013/108759
PCT Pub. Date: Jul. 25, 2013

(65) Prior Publication Data
US 2015/0002180 A1 Jan. 1, 2015

(30) Foreign Application Priority Data
Jan. 18, 2012 (JP) .................................. 2012-008505

(51) Int. Cl.
*G01R 1/067* (2006.01)
*G01R 1/073* (2006.01)
*G01R 31/28* (2006.01)

(52) U.S. Cl.
CPC ........ *G01R 1/07307* (2013.01); *G01R 1/07378* (2013.01); *G01R 31/2889* (2013.01)

(58) Field of Classification Search
None
See application file for complete search history.

(56) References Cited

U.S. PATENT DOCUMENTS

| | | | |
|---|---|---|---|
| 5,806,181 A | 9/1998 | Khandros et al. | |
| 7,180,315 B2 * | 2/2007 | Tunaboylu | G01R 1/07378 324/756.03 |
| 2008/0075929 A1 | 3/2008 | Shimada et al. | |
| 2010/0001748 A1 | 1/2010 | Sasaki et al. | |

(Continued)

FOREIGN PATENT DOCUMENTS

| | | |
|---|---|---|
| EP | 2436662 A1 | 4/2012 |
| JP | 2001-524258 A | 11/2001 |

(Continued)

OTHER PUBLICATIONS

Office Action dated Jul. 25, 2014, issued for the corresponding Taiwanese patent application No. 102101937.

(Continued)

*Primary Examiner* — Minh N Tang
(74) *Attorney, Agent, or Firm* — Locke Lord LLP

(57) ABSTRACT

A space transformer includes: a ceramic substrate that contains enstatite and boron nitride as components; a through hole running through in a thickness direction with respect to a sintered body in which the boron nitride is oriented in one direction; conductive material provided inside the through hole; and a wiring pattern including a plurality of electrodes provided on each of two principal surfaces, wherein a wiring pitch in the wiring pattern on one principal surface is different from a wiring pitch in the wiring pattern on the other principal surface.

9 Claims, 11 Drawing Sheets

(56) References Cited

U.S. PATENT DOCUMENTS

| | | | |
|---|---|---|---|
| 2010/0327897 A1* | 12/2010 | Kazama | G01R 1/07378 324/756.03 |
| 2013/0115416 A1 | 5/2013 | Nakamura et al. | |

FOREIGN PATENT DOCUMENTS

| | | |
|---|---|---|
| JP | 2002-050869 A | 2/2002 |
| JP | 3386077 B2 | 3/2003 |
| JP | 2004-336062 A | 11/2004 |
| JP | 2005-164600 A | 6/2005 |
| JP | 2008-024530 A | 2/2008 |
| JP | 2010-275149 A | 12/2010 |
| JP | 2012-020901 A | 2/2012 |
| TW | 1276618 A | 3/2007 |
| WO | WO-96/15458 A1 | 5/1996 |
| WO | WO-96/16440 A1 | 5/1996 |
| WO | WO-96/17378 A1 | 6/1996 |
| WO | WO-96/38858 A2 | 12/1996 |
| WO | WO-01/71779 A2 | 9/2001 |
| WO | WO-2007/142204 A1 | 12/2007 |
| WO | WO-2010/137440 A1 | 12/2010 |

OTHER PUBLICATIONS

International Search Report mailed Mar. 5, 2013, issued for PCT/JP2013/050593.

* cited by examiner

SPACE TRANSFORMER HAVING A CERAMIC SUBSTRATE WITH A WIRING PATTERN FOR USE IN A PROBE CARD

FIELD

The present invention relates to a space transformer that transforms wiring pitch and to a probe card provided with the space transformer to conduct an electrical characteristics test on a test subject.

BACKGROUND

In an inspection process of semiconductors, an electrical characteristics test is conducted by bringing probes having electrical conductivity into contact with the semiconductors in a state of a semiconductor wafer prior to dicing to detect a defective piece (a wafer-level testing). When the wafer-level testing is conducted, used for transmitting test signals to the semiconductor wafer is a probe card that houses a number of probes. The probe card includes a probe head that holds the probes, a space transformer that transforms minute wiring pitches between the probes in the probe head, and an interconnect substrate that connects the space transformer to an inspection device that outputs the test signals.

In the wafer-level testing, the probes are brought into contact with dies on the semiconductor wafer by the probe card scanning for each die individually. On the semiconductor wafer, however, a few hundreds to a few ten thousands of dies are formed. Thus, testing a single semiconductor wafer requires a considerable amount of time, thereby causing a rise in cost as the number of dies increases.

To resolve the above-described problems in the wafer-level testing, a method of collectively bringing a few hundreds to a few ten thousands of probes into contact with all of the dies on the semiconductor wafer or at least approximately a quarter to a half of the dies on the semiconductor wafer (a full wafer-level testing) has also been used recently (e.g., see Patent Literature 1). In this method, to bring the probes into contact with the electrodes on the semiconductor wafer correctly, known are technologies that maintain the accuracy of the positions of tips of the probes by accurately keeping the parallelism and flatness of the probe card with respect to the surface of the semiconductor wafer, and that align the semiconductor wafer with a high degree of accuracy (e.g., see Patent Literature 2 or Patent Literature 3).

CITATION LIST

Patent Literature

Patent Literature 1: Japanese National Publication of International Patent Application No. 2001-524258
Patent Literature 2: Japanese Patent No. 3386077
Patent Literature 3: Japanese Patent Application Laid-open No. 2005-164600

SUMMARY

Technical Problem

In the conventional probe card, however, the space transformer needs repeated layer-stacking to form the internal wiring, and the structure thereof has been complicated. Consequently, there have been problems in that the space transformer takes time to manufacture forcing it to be expensive, and enlarging its diameter larger than 12 inches is difficult to achieve.

Furthermore, the conventional space transformer has a thermal expansion coefficient greater than that of a semiconductor wafer that is formed of silicon as a major component. Thus, depending on the temperature at the time of inspection, positional deviation may arise between the positions of the tips of the probes and the electrodes of the semiconductor wafer.

In view of the problems described above, it is an object of the present invention to provide a space transformer having a thermal expansion coefficient close to that of silicon and being simple in structure and suitable for enlarging the diameter thereof, and to provide a probe card that includes the space transformer.

Solution to Problem

According to one aspect of the present invention, there is provided a space transformer including: a ceramic substrate that contains enstatite and boron nitride as components; a through hole running through in a thickness direction with respect to a sintered body in which the boron nitride is oriented in one direction; conductive material provided inside the through hole; and a wiring pattern including a plurality of electrodes provided on each of two principal surfaces, wherein a wiring pitch in the wiring pattern on one principal surface is different from a wiring pitch in the wiring pattern on the other principal surface.

Moreover, in the above-described space transformer according to the present invention, at least one principal surface of the ceramic substrate is provided with the wiring pattern inside or on a surface of thin film of polyimide layer-stacked and firmly fixed on the principal surface.

Moreover, in the above-described space transformer according to the present invention, the ceramic substrate has an orientation index $K=|\log_{10}\{(I_{(100)}/I_{(002)})///(I_{(100)}I_{(002)})\perp\}|$ equal to or higher than 0.8 that is calculated based on a ratio $(I_{(100)}/I_{(002)})//$ between intensity of X-ray diffraction $I_{(002)}$ along a (002) plane of a crystal of the boron nitride and intensity of X-ray diffraction $I_{(100)}$ along a (100) plane thereof when irradiated with an X-ray in the orientation direction of the boron nitride and a ratio $(I_{(100)}/I_{(002)})\perp$ between the intensity of X-ray diffraction $I_{(002)}$ along the (002) plane and the intensity of X-ray diffraction $I_{(100)}$ along the (100) plane when irradiated with an X-ray in a direction orthogonal to the orientation direction.

Moreover, in the above-described space transformer according to the present invention, the ceramic substrate has a thermal expansion coefficient of $3\times10^{-6}$ to $5\times10^{-6}/°C$. that is the measured thermal expansion coefficient based on JIS R 1618 and is the thermal expansion coefficient in a direction parallel to the direction the boron nitride is oriented at temperatures between 20 and 250° C.

Moreover, in the above-described space transformer according to the present invention, the ceramic substrate has a three-point bending strength equal to or greater than 200 megapascals that is measured based on JIS R 1601.

Moreover, in the above-described space transformer according to the present invention, the ceramic substrate has a relative density equal to or greater than 99%.

Moreover, in the above-described space transformer according to the present invention, the ceramic substrate contains the boron nitride in a hexagonal crystal structure and of scaly particles.

Moreover, a probe card according to the present invention includes: any one of the above-described space transformers; a plurality of probes formed of conductive material, and firmly fixed to each of a plurality of electrodes provided on one principal surface side of the ceramic substrate on which a wiring pitch is smaller than that on another principal surface side; and an interconnect substrate layer-stacked on the other principal surface side of the ceramic substrate.

Moreover, in the above-described probe card according to the present invention, the wiring pattern on the principal surface side onto which the probes are firmly fixed is formed inside a base material formed of a thin film of polyimide in a single layer or multiple layers.

Moreover, a probe card according to the present invention includes: any one of the above-described space transformers; a plurality of probes formed of conductive material; a probe head that holds the probes and is layer-stacked on the principal surface of the space transformer on one side on which a pitch between the electrodes is relatively small; and an interconnect substrate layer-stacked on the principal surface of the space transformer on a side different from the principal surface on which the probe head is layer-stacked.

Advantageous Effects of Invention

According to the present invention, provided is a ceramic substrate that contains enstatite and boron nitride as components and has through holes running through in the thickness direction of a sintering body in which the boron nitride is oriented in one direction. The through holes are filled with conductive material. It is thus possible to provide a space transformer that has a thermal expansion coefficient close to that of silicon and is simple in structure and suitable for enlarging the diameter thereof, and to provide a probe card that includes the space transformer.

DESCRIPTION OF EMBODIMENTS

With reference to the accompanying drawings, the following describes forms to embody the present invention (hereinafter, referred to as "embodiments"). It should be noted that the drawings are schematic, and thus the relation between the thickness and width of various portions, the ratio of thicknesses of the respective portions, and others may differ from reality. Naturally, there may be portions the relation and the ratio of dimensions of which differ between the drawings.

First Embodiment

Figure 1:
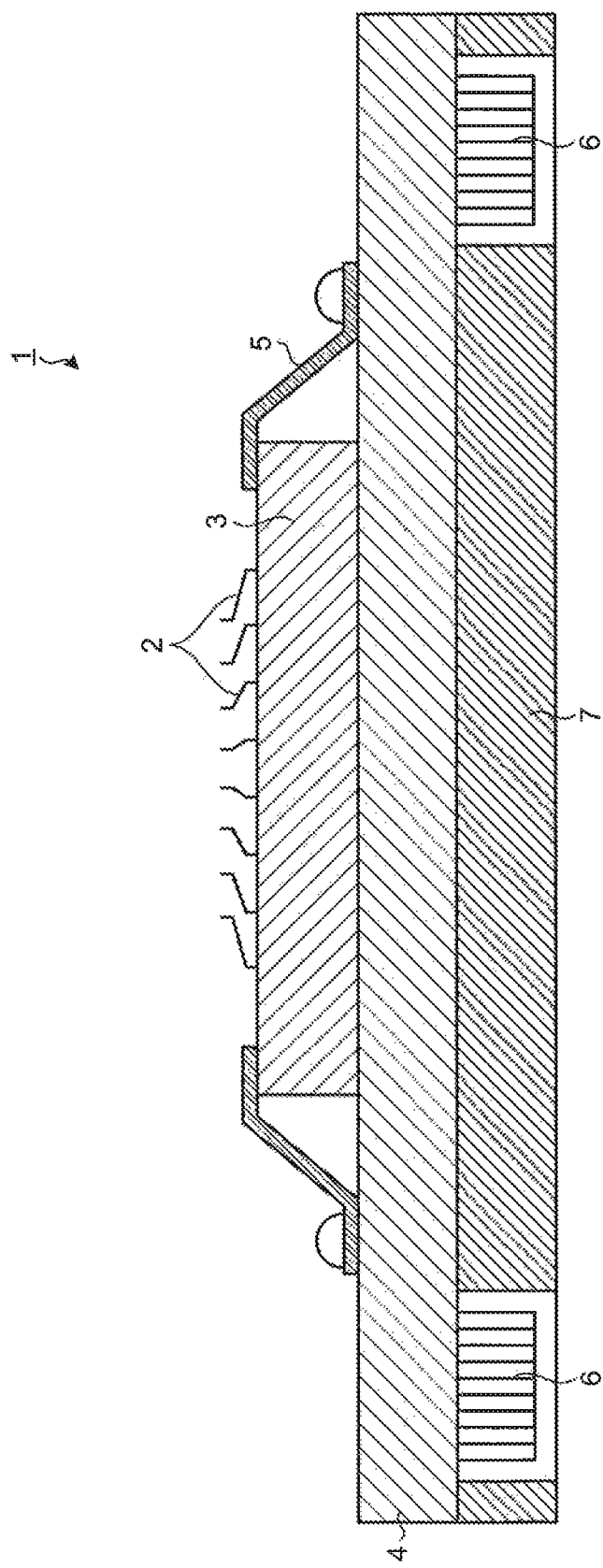
FIG. 1 is a cross-sectional view illustrating the structure of a probe card according to a first embodiment of the present invention.
Figure 2:
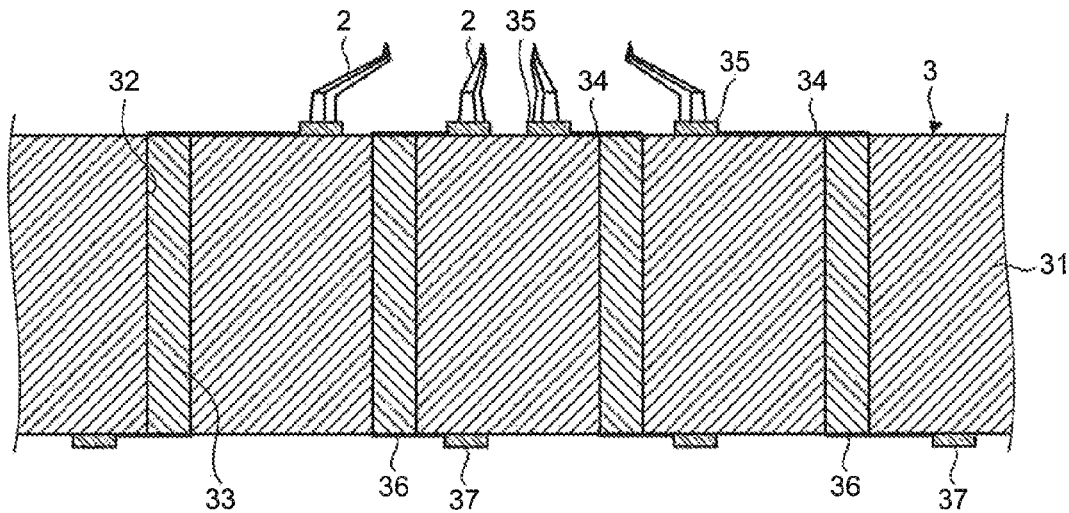
FIG. 2 is a cross-sectional view illustrating the structure of a relevant portion of a space transformer in the first embodiment of the invention.

FIG. 1 is a cross-sectional view illustrating the structure of a probe card according to a first embodiment of the present invention. FIG. 2 is a cross-sectional view illustrating the structure of a relevant portion of a space transformer included in the probe card in the first embodiment of the invention. A probe card 1 illustrated in FIGS. 1 and 2 includes a plurality of conductive probes 2 arranged corresponding to a test subject; a space transformer 3 that is a disc-shaped substrate to which the end portions of the probes 2 are attached and transforms minute wiring pitches (pitches) between the probes 2; an interconnect substrate 4 in a disc shape with a diameter larger than that of the space transformer 3, having a base material of insulating material such as resin, and connecting the wirings projected from the space transformer 3 to an inspection device; plate springs 5 firmly fixed onto the interconnect substrate 4 and holding the space transformer 3; connectors 6 provided on a surface on the side opposite to the surface onto which the space transformer 3 is layer-stacked out of the surfaces of the interconnect substrate 4 to achieve the connection to the inspection device that includes a circuit structure to generate test signals; and a reinforcing member 7 attached to the surface on the side on which the connectors 6 are provided out of the surfaces of the interconnect substrate 4 and reinforcing the interconnect substrate 4 to prevent it from deforming.

FIG. 2 is a diagram illustrating the structure of the probes 2 as well as the structure of a relevant portion of the space transformer 3.

The probes 2 are in cantilever shapes and the base end portions thereof are firmly fixed onto the space transformer 3 by soldering, for example. Note that the structure of the probes 2 described here is only an example, and the probes 2 can be constructed using any of the various types of conventionally known probes.

The space transformer 3 includes, as a primary material, a ceramic substrate 31 that contains enstatite and boron nitride as components and is a sintered body in which the boron nitride is oriented in one direction. On the two principal surfaces of the ceramic substrate 31, respective wiring patterns including a plurality of electrodes are provided. Of these wiring patterns, the wiring pitch of the wiring pattern on one principal surface is different from the wiring pitch of the wiring pattern on the other principal surface.

On the ceramic substrate 31, a plurality of through holes 32 are formed. Provided inside the through holes 32 are filling portions 33 filled by plating with conductive material such as silver and copper or by filling conductive paste. The through holes 32 are formed by any processing method such as drilling, punching, laser beam machining, electron beam machining, ion beam machining, press working, wire cut machining, or etching.

On the principal surface on the side on which the probes 2 are attached (the upper surface in FIG. 2) out of the principal surfaces of the ceramic substrate 31, provided are a plurality of wirings 34 the end portions of which connect to the surfaces of the filling portions 33 and a plurality of electrodes 35 that connect to the end portions on the opposite side of the wirings 34. On each of the electrodes 35, the base end portion of the probe 2 is firmly fixed by soldering, for example. The wirings 34 can be formed using any method out of plating, sputtering, and foil joining, for example. More specifically, the wirings 34 can be formed by etching and blasting after a metallic layer is formed on the entire surface. Furthermore, the wirings 34 can be pattern-formed by plating and sputtering after a mask is formed.

On the principal surface on the side facing to the interconnect substrate 4 (the lower surface in FIG. 2) out of the principal surfaces of the ceramic substrate 31, provided are a plurality of wirings 36 the end portions of which connect to the surfaces of the filling portions 33 and a plurality of electrodes 37 that connect to the end portions on the opposite side of the wirings 36. The minimum value of the center-to-center distance of the electrodes 37 is greater than the maximum value of the center-to-center distance of the electrodes 35 onto which the probes 2 are firmly fixed, as one example. Each of the electrodes 37 connects to an electrode provided on the surface of the interconnect substrate 4 facing thereto. The wirings 36 can be formed in the same manner as the wirings 34.

The wirings 34 and 36, and the electrodes 35 and 37 are formed using copper, copper alloy, silver, gold, tin, nickel, aluminum, or aluminum alloy.

The particles of boron nitride are oriented in a direction parallel to the principal surface of the ceramic substrate 31. Thus, in the ceramic substrate 31, the thermal expansion coefficient in the orientation direction is comparable to the thermal expansion coefficient of a semiconductor wafer regardless of temperature. Consequently, the probes 2 attached to the space transformer 3 can be brought into contact with the semiconductor wafer accurately regardless of temperature.

Figure 3:
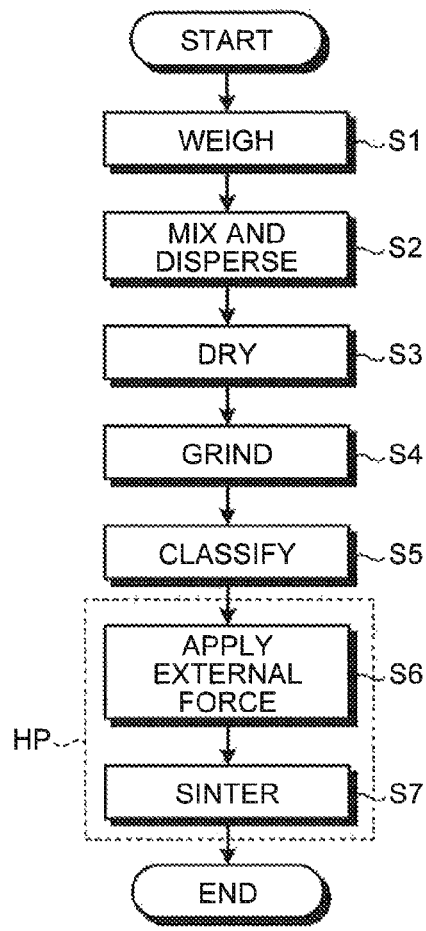
FIG. 3 is a flowchart illustrating an outline of a method of manufacturing a ceramic substrate that is a primary material of the space transformer in the first embodiment of the invention.

Now, the method of manufacturing the ceramic substrate 31 will be described with reference to the flowchart in FIG. 3. First, raw materials including boron nitride (BN), silicon oxide ($SiO_2$), and magnesium oxide (MgO) as raw materials, and including yttrium oxide ($Y_2O_3$) and aluminum oxide ($Al_2O_3$) as sintering additives are weighed (Step S1).

The magnesium oxide is added here, because promoting the reaction sintering produces enstatite ($MgSiO_3$), to make enstatite ($MgSiO_3$) and boron nitride (BN) be the principal component phase of the ceramic substrate 31 to be fired, and to adjust the thermal expansion coefficient. In addition to the sintering additives described above, complex oxides that have been conventionally used, such as lanthanoid metal oxide and spinel, a mixture thereof, and an additive obtained by adding magnesium oxide to the mixture can be used as the sintering additive.

The substances weighed at Step S1 are then mixed and dispersed (Step S2). Specifically, a solution obtained by adding a solvent, such as water or alcohol, to the raw materials weighed at Step S1 is mixed and dispersed by a wet ball mill. The mixture obtained at Step S2 is then dried in an evaporator to eliminate the solvent (Step S3). This makes the mixture of boron nitride, silicon oxide, magnesium oxide, and the sintering additives into an aggregate in flake form. In the mixture, the content rate of boron nitride is 49.3% by weight, the content rate of silicon oxide is 24.8% by weight, the content rate of magnesium oxide is 19.6% by weight, the content rate of yttrium oxide is 4.7% by weight, and the content rate of aluminum oxide is 1.6% by weight.

The aggregate of the mixture obtained at Step S3 is then ground (Step S4). At Step S4, at least one of a mortar and a dry ball mill is used in accordance with particle size distribution to be achieved after the grinding. The mixture is then classified by using mesh pass (Step S5), and the average particle diameter of the aggregate is made small to homogenize the particle size.

Subsequently, an external force is caused to act in a predetermined direction on the mixture whose average particle diameter is made small, and whose particle size is homogenized (Step S6), and the mixture is sintered (Step S7). In the first embodiment, a hot-press sintering method can be applied to the method for sintering the mixture. The hot-press sintering method is a method for sintering a mixture while pressing the mixture disposed in a mold made of carbon in a hot-press device in a predetermined direction. Therefore, if the mixture is sintered by using the hot-press sintering method, the causing the external force to act at Step S6 and the sintering at Step S7 are performed collectively (Step HP indicated by a dashed-line region in FIG. 3).

In the above-described method of manufacturing the ceramic substrate 31, the hot-press sintering temperature at Step HP is 1200 to 1300° C. As in the foregoing, because the ceramic substrate 31 is sintered at a temperature lower than ordinary ceramics, for example, the sintering temperature (1750° C.) of a ceramic member in Patent Literature 2, the binding of the mold and the ceramic substrate 31 by the reaction with the mold made of carbon in the sintering process can be moderated.

Boron nitride used in the first embodiment has a hexagonal crystal structure and of scaly particles. Therefore, the action of the external force directing in one direction causes the scale-shaped surface to align in a direction approximately orthogonal to the direction of the action of the external force. As a result, the mixture is oriented in a direction orthogonal to the direction of action of the external force, that is, in parallel along the plate surface of the sintered body.

With the process from Step S1 to Step S7 described above, the ceramic substrate 31 is manufactured. The ceramic substrate 31 manufactured in this manner includes at least enstatite ($MgSiO_3$) and boron nitride (BN) as components, has excellent electrical insulation, and has boron nitride particles oriented in one direction because the directions of surfaces of the boron nitride particles in a scaly shape are approximately aligned.

At this time, in the ceramic substrate 31 thus manufactured, the content rate of enstatite is 41.4 (% by weight) based on a theoretically calculated value. The theoretically calculated value is calculated based on an assumption that all of the silicon oxide used for the raw material is used for generating enstatite.

Figure 4:
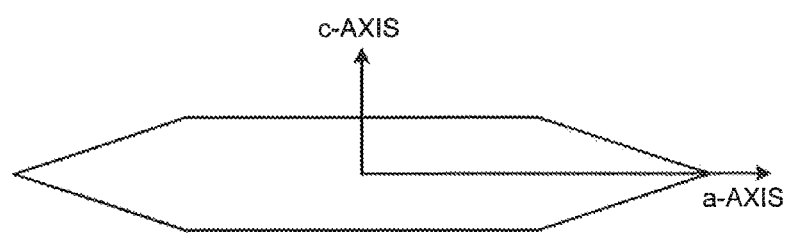
FIG. 4 is a diagram illustrating an a-axis and a c-axis of hexagonal boron nitride included in the ceramic substrate that is the primary material of the space transformer in the first embodiment of the invention.

FIG. 4 illustrates the a-axis and the c-axis of the boron nitride particles in a scaly shape. It is preferable that the sintered body obtained by sintering have the orientation index equal to or higher than 0.8. The orientation index is an absolute value of the common logarithm of orientation, and is calculated by the following Expression:

$$K = |\log_{10}\{(I_{(100)}/I_{(002)})// / (I_{(100)}/I_{(002)})\perp\}| \quad (1)$$
$$= |\log_{10}\{I.O.P.\}|$$

Where the term $I_{(100)}$ is the intensity of X-ray diffraction along a (100) plane of a boron nitride crystal when a specimen is irradiated with an X-ray. Furthermore, the term $I_{(002)}$ is the intensity of X-ray diffraction along a (002) plane of the boron nitride crystal of the same. The term $I_{(100)}/I_{(002)})//$ is a ratio between the intensity of X-ray diffraction $I_{(100)}$ along the (100) plane of the boron nitride crystal and the intensity of X-ray diffraction $I_{(002)}$ along the (002) plane thereof when the specimen is irradiated with an X-ray in a direction parallel to a pressure direction in pressure sintering. The term $(I_{(100)}/I_{(002)})\perp$ is a ratio between the intensity of X-ray diffraction $I_{(100)}$ along the (100) plane and the intensity of X-ray diffraction $I_{(002)}$ along the (002) plane when the specimen is irradiated with an X-ray in a direction perpendicular to the pressure direction. The orientation index K is a value equal to or greater than zero.

The term I.O.P. on the right-hand side of Expression (1) is the orientation (the index of orientation preference). If I.O.P.<1, a c-axis of the boron nitride crystal corresponding to the (002) plane is oriented in parallel with the pressure direction in the specimen, and scaly surfaces of the boron nitride crystals are aligned in the direction of the principal surfaces of the fired ceramic substrate 31. Furthermore, if I.O.P.>1, an a-axis of the boron nitride crystal corresponding to the (100) plane is oriented in parallel with the pressure direction in the specimen, and the scaly surfaces of the boron nitride crystals are aligned in the direction parallel to the pressure direction. If I.O.P.=1 (K=0), it represents that the orientations of the boron nitride particles are random in the specimen.

The I.O.P. is explained in detail in J. Am. Ceram. Soc. 82 [1] 156-160 (1999) "Effect of the Orientation of Boron Nitride Grains on the Physical Properties of Hot-Pressed Ceramics." by Milan Hubacek, et al.

In the ceramic substrate 31, it is preferable that the thermal expansion coefficient in the direction the boron nitride is orientated at temperatures between 20 to 250° C., which is measured based on JIS R 1618 (Measuring method of thermal expansion of fine ceramics by thermomechanical analysis), be within the range of $3\times10^{-6}$ to $5\times10^{-6}$/° C. This makes the ceramic substrate 31 have a value of the thermal expansion coefficient in the orientation direction of the boron nitride particles close to the thermal expansion coefficient of silicon of $3.4\times10^{-6}$/° C.

In the ceramic substrate 31, it is preferable that the three-point bending strength, which is measured based on JIS R 1601 (Testing method for flexural strength (modulus of rupture) of fine ceramics at room temperature), be equal to or greater than 200 megapascals. This increases the strength against a warp even if the ceramic substrate 31 is in a thin plate-like shape.

In the ceramic substrate 31, it is preferable that the relative density be equal to or greater than 99%. This makes the components in the ceramic substrate 31 dense by sintering, and increases the strength against a warp.

The causing the external force to act and the sintering in the method for manufacturing the ceramic substrate 31 according to the present embodiment is not limited to the hot-press sintering method. For example, a slip-cast method may be applied to the causing the external force to act. If the slip-cast method is applied, the boron nitride particles are precipitated and accumulated in the mold by gravity serving as the external force. This causes the boron nitride particles to be oriented. When the aggregate including the boron nitride particles oriented in this manner is sintered, a conventionally known sintering method, such as a reduced-pressure sintering method and an inert-atmosphere sintering method, may be applied. Furthermore, after the application of the slip-cast method, the aggregate may be sintered by using the hot-press sintering method. If the hot-press sintering method is used, the direction of orientation of the boron nitride particles caused by the slip-cast method needs only to be orthogonal to the pressure direction in the hot-press sintering method.

According to the first embodiment of the invention in the foregoing, provided is a ceramic substrate that contains enstatite and boron nitride as components and has through holes running through in the thickness direction of a sintered body in which the boron nitride is oriented in one direction. The through holes are filled with conductive material It is thus possible to provide a space transformer that has a thermal expansion coefficient close to that of silicon and is simple in structure and suitable for enlarging the diameter thereof, and to provide a probe card that includes the space transformer.

Furthermore, according to the first embodiment, the ceramic is not multilayered, and thus it is possible to manufacture a large-sized substrate and the yield rate thereof is good.

Moreover, according to the first embodiment, joining the probes to the electrodes on the narrow pitch side can construct a probe card in which the probe head and the space transformer are practically combined. This structure enables further narrowing of the pitch to be achieved.

Modification 1-1

Figure 5:
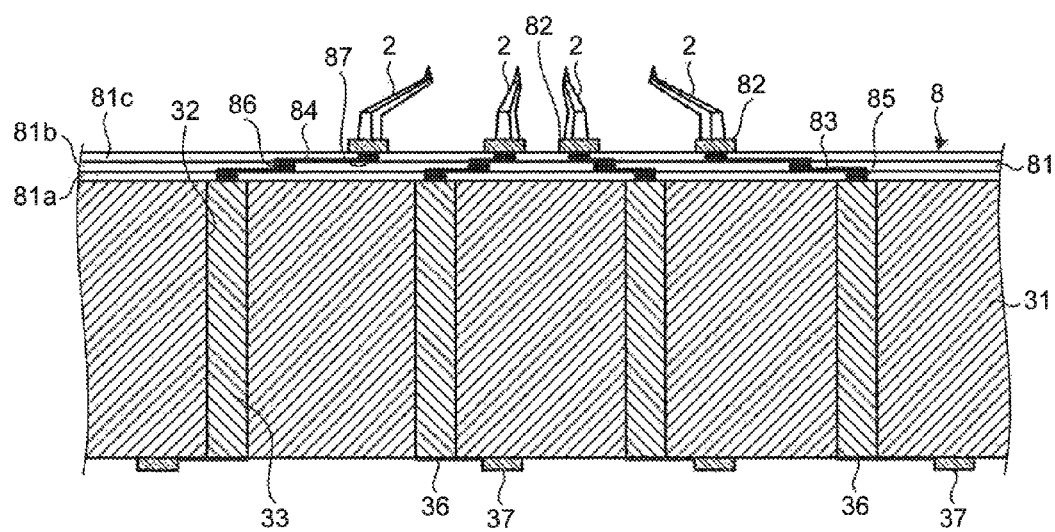
FIG. 5 is a cross-sectional view illustrating the structure of a relevant portion of a space transformer according to a modification 1-1 of the first embodiment of the invention.

FIG. 5 is a cross-sectional view illustrating the structure of a relevant portion of a space transformer included in a probe card according to a modification 1-1 of the first embodiment. In a space transformer 8 illustrated in FIG. 5, the structure of the surface on the side on which the probes 2 are firmly fixed is different from that of the above-described space transformer 3.

On the surface on the side on which the probes 2 are firmly fixed (the upper surface in FIG. 5) out of the principal surfaces of the ceramic substrate 31, a thin-film multilayer wiring sheet 81 is layer-stacked and firmly fixed by adhesion, for example. On the thin-film multilayer wiring sheet 81, electrodes 82 are provided.

The thin-film multilayer wiring sheet 81 includes three thin films 81a, 81b, and 81c of polyimide which are layer-stacked to constitute a base material. The thin-film multilayer wiring sheet 81 includes wirings 83 provided on the surface of the thin film 81*a* that is layer-stacked on the ceramic substrate 31, and wirings 84 provided on the surface of the thin film 81*b* that is layer-stacked on the thin film 81*a*. In the thin film 81*a*, conductive portions 85, which connect the filling portions 33 and the wirings 83 together, run through. In the thin film 81*b*, conductive portions 86, which connect the wirings 83 and the wirings 84 together, run through. In the thin film 81*c*, conductive portions 87, which connect the electrodes 82 and the wirings 84 together, run through. Polyimide that is in a liquid form (photosensitive polyimide) may be hardened, or that in a film form may be affixed. In the latter case, at the time the conductive portions and the wirings are formed, the through holes in the film may be made by laser and the through holes may be filled by plating, for example.

The electrodes 82, the wirings 83 and 84, the conductive portions 85, 86, and 87 are formed using copper, copper alloy, silver, gold, tin, nickel, aluminum, or aluminum alloy. The conductive portions 85, 86, and 87 are formed by performing plating, sputtering, or ion plating.

The structure of the principal surface on the side facing to the interconnect substrate 4 (the lower surface in FIG. 5) out of the principal surfaces of the ceramic substrate 31 is the same as that of the space transformer 3 described in the first embodiment. The minimum value of the center-to-center distance of the electrodes 37 is greater than the maximum value of the center-to-center distance of the electrodes 82.

According to the modification 1-1 of the first embodiment in the foregoing, the wirings on the probe side are inside the polyimide, and thus the routing of wiring is easily made.

Furthermore, according the modification 1-1, the polyimide constituting the base material of the thin-film multilayer wiring sheet 81 has an elastic modulus substantially lower than that of the ceramic substrate 31, and thus can easily follow the expansion and contraction of the ceramic substrate 31 by heat.

According to the modification 1-1, when the probes 2 are firmly fixed by soldering, it is more preferable because, even when the solder is transferred to the peripheries of the electrodes 82 by contamination, the solder is not transferred onto the wirings 83.

Moreover, according to the modification 1-1, even when the impedance matching of metal wiring is necessary, or even when the adjustment of the positional relation between the through holes and the electrodes is necessary, it can be handled by arranging a polyimide layer formed with the wiring on the ceramic.

While the thin-film multilayer wiring sheet 81 is formed of two layers of wiring in the modification 1-1, the thin-film multilayer wiring sheet can be constructed by a greater number of layers of wiring. Furthermore, in place of the thin-film multilayer wiring sheet 81, a thin-film wiring sheet formed of a single layer of wiring can also be used.

Second Embodiment

Figure 6:
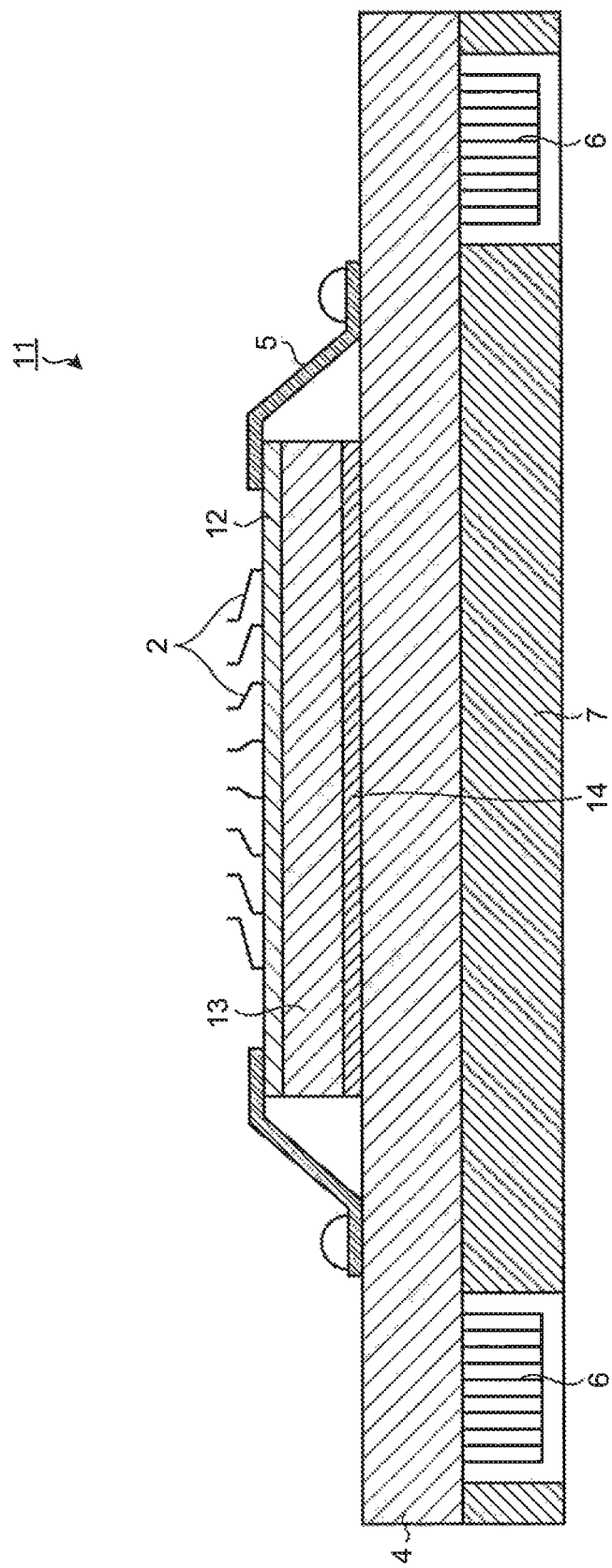
FIG. 6 is a cross-sectional view illustrating the structure of a probe card according to a second embodiment of the invention.

FIG. 6 is a cross-sectional view illustrating the structure of a probe card according to a second embodiment of the invention. A probe card 11 illustrated in FIG. 6 includes a plurality of probes 2; a disc-shaped probe head 12 that includes a base material of insulating material, is attached with the end portions of the probes 2 to hold the probes 2, and is provided with wiring that connects from the holding surface for the probes 2 to the surface on the opposite side; a space transformer 13 that transforms minute wiring pitches between electrodes in the probe head 12; an interposer 14 that relays the wiring projected from the space transformer 13; the interconnect substrate 4 that connects the wiring relayed by the interposer 14 to an inspection device; the plate springs 5; the connectors 6; and the reinforcing member 7.

Figure 7:
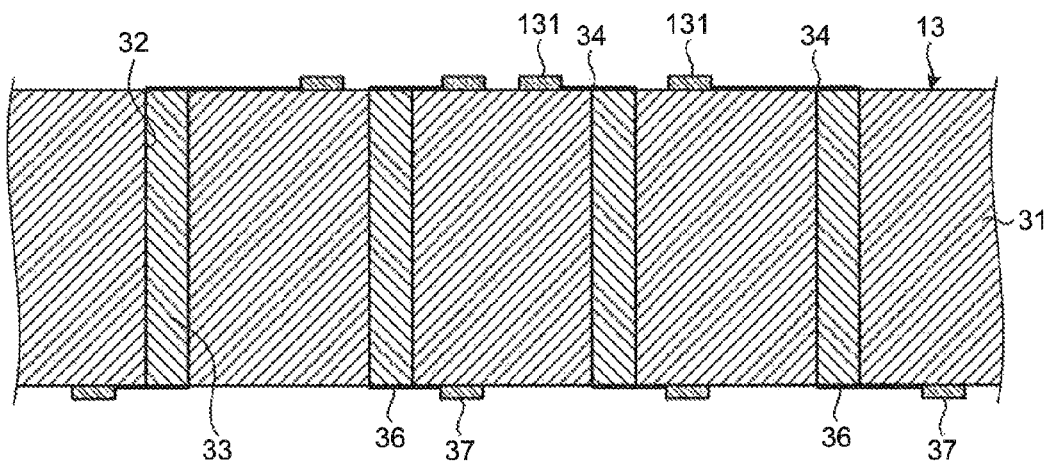
FIG. 7 is a cross-sectional view illustrating the structure of a relevant portion of a space transformer in the second embodiment of the invention.

FIG. 7 is a cross-sectional view illustrating the structure of a relevant portion of the space transformer 13. The space transformer 13 illustrated in FIG. 7 includes the ceramic substrate 31 described in the first embodiment as a primary material. On the two principal surfaces of the ceramic substrate 31, respective wiring patterns including a plurality of electrodes are provided, and the center-to-center distance of the electrodes of the wiring pattern on one principal surface is different from the center-to-center distance of the electrodes of the wiring pattern on the other principal surface.

On the principal surface on the side facing to the probe head 12 (the upper surface in FIG. 7) out of the principal surfaces of the ceramic substrate 31, provided are a plurality of wirings 34 the end portions of which connect to the surfaces of the filling portions 33, and a plurality of electrodes 131 that connect to the end portions on the opposite side of the wirings 34. The electrodes 131 are arranged in the same pattern as that of the electrodes provided on the surface of the probe head 12 facing thereto.

The structure of the principal surface on the side facing to the interposer 14 (the lower surface in FIG. 7) out of the principal surfaces of the ceramic substrate 31 is the same as that of the space transformer 13 described in the first embodiment. The minimum value of the center-to-center distance of the electrodes 37 is greater than the maximum value of the center-to-center distance of the electrodes 131.

According to the second embodiment of the invention in the foregoing, provided is a ceramic substrate that contains enstatite and boron nitride as components and has through holes running through in the thickness direction of a sintered body in which the boron nitride is oriented in one direction. The through holes are filled with conductive material. It is thus possible to provide a space transformer that has a thermal expansion coefficient close to that of silicon and is simple in structure and suitable for enlarging the diameter thereof, and to provide a probe card that includes the space transformer.

Furthermore, according to the second embodiment, the probes can be brought into contact with the electrodes of the semiconductor wafer accurately regardless of temperature even in a situation of conducting a plurality of tests under different temperature environments. Consequently, it is not necessary to exchange the probe heads according to temperature zones, and thus the reduction in test time and the reduction in the cost required for the test can be achieved.

Modification 2-1

Figure 8:
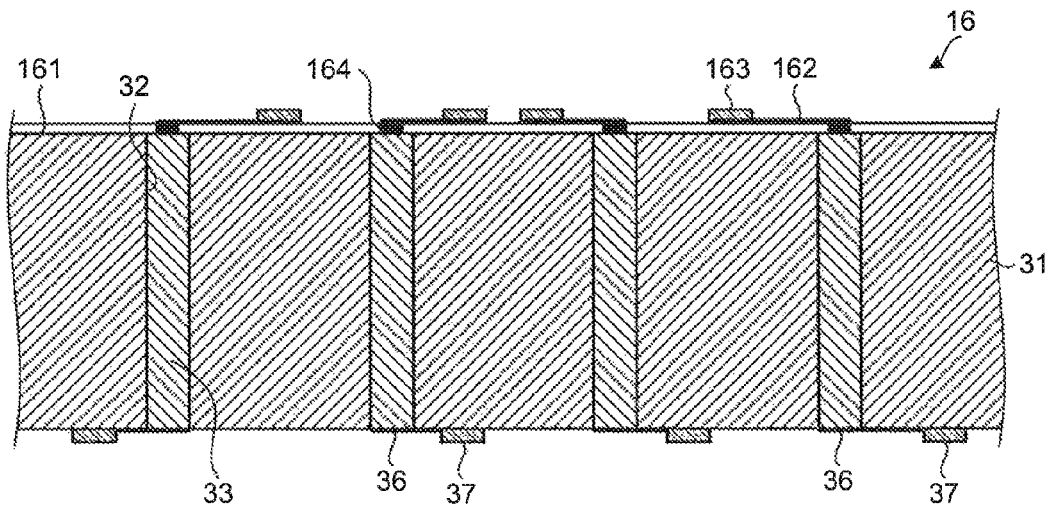
FIG. 8 is a cross-sectional view illustrating the structure of a relevant portion of a space transformer according to a modification 2-1 of the second embodiment of the invention.

FIG. 8 is a cross-sectional view illustrating the structure of a relevant portion of a space transformer according to a modification 2-1 of the second embodiment. A space transformer 16 illustrated in FIG. 7 includes the ceramic substrate 31 as a primary material.

On the principal surface on the side facing to the probe head 12 (the upper surface in FIG. 8) out of the principal surfaces of the ceramic substrate 31, provided are a thin film sheet 161 firmly fixed by adhesion, for example, wirings 162 provided on the thin film sheet 161, and electrodes 163 that connect to the wirings 162 on the thin film sheet 161.

The thin film sheet 161 includes, inside the base material formed of polyimide, conductive portions 164 that run through the base material connecting each of the filling portions 33 and the wirings 162 together.

The electrodes 163 make contact with the respective electrodes provided on the surface of the probe head 12 facing thereto.

The structure of the principal surface on the side facing to the interposer 14 (the lower surface in FIG. 8) out of the principal surfaces of the ceramic substrate 31 is the same as that of the space transformer 13 described in the foregoing. The minimum value of the center-to-center distance of the electrodes 37 is greater than the maximum value of the center-to-center distance of the electrodes 163.

Modification 2-2

Figure 9:
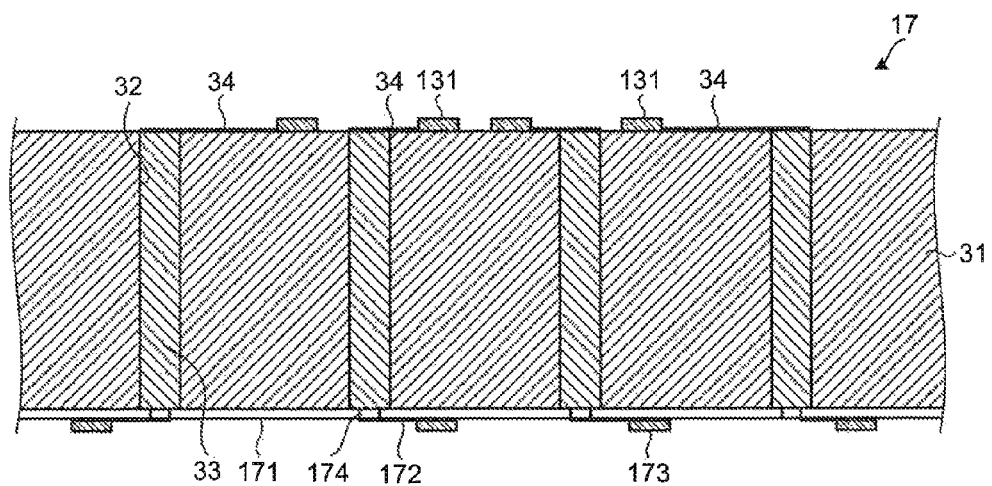
FIG. 9 is a cross-sectional view illustrating the structure of a relevant portion of a space transformer according to a modification 2-2 of the second embodiment of the invention.

FIG. 9 is a cross-sectional view illustrating the structure of a relevant portion of a space transformer according to a modification 2-2 of the second embodiment. A space transformer 17 illustrated in FIG. 9 includes the ceramic substrate 31 as a primary material.

The structure of the principal surface on the side facing to the probe head 12 (the upper surface in FIG. 9) out of the principal surfaces of the ceramic substrate 31 is the same as that of the space transformer 13 described in the second embodiment.

On the principal surface on the side facing to the interposer 14 (the lower surface in FIG. 9) out of the principal surfaces of the ceramic substrate 31, provided are a thin film sheet 171 fixed by adhesion, for example, wirings 172 provided on the thin film sheet 171, and electrodes 173 that connect to the wirings 172 on the thin film sheet 171.

The thin film sheet 171 includes, inside the base material formed of polyimide, conductive portions 174 that run through the base material connecting each of the filling portions 33 and the wirings 172 together.

The electrodes 173 make contact with the respective electrodes provided on the surface of the interposer 14 facing thereto. The minimum value of the center-to-center distance of the electrodes 173 is greater than the maximum value of the center-to-center distance of the electrodes 131.

Modification 2-3

Figure 10:
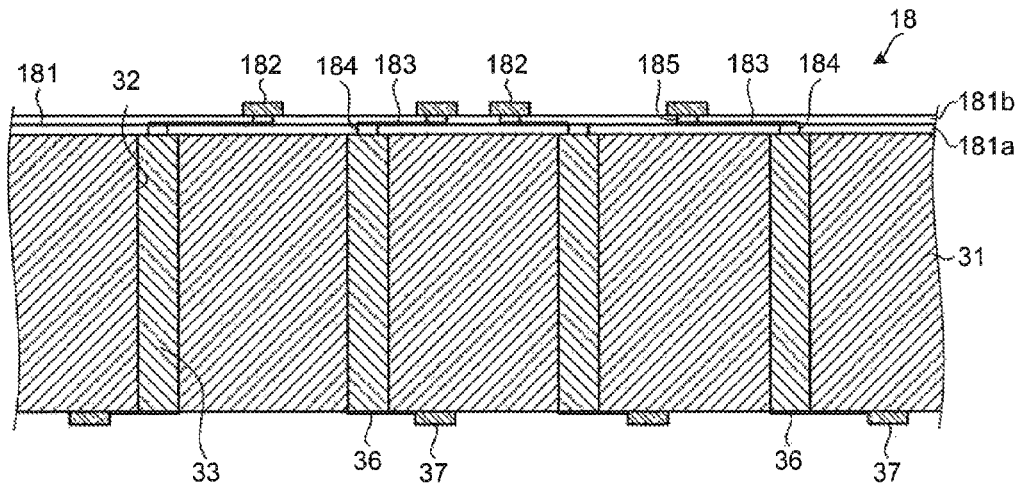
FIG. 10 is a cross-sectional view illustrating the structure of a relevant portion of a space transformer according to a modification 2-3 of the second embodiment of the invention.

FIG. 10 is a cross-sectional view illustrating the structure of a relevant portion of a space transformer according to a modification 2-3 of the second embodiment. A space transformer 18 illustrated in FIG. 10 includes the ceramic substrate 31 as a primary material.

On the principal surface on the side facing to the probe head 12 (the upper surface in FIG. 10) out of the principal surfaces of the ceramic substrate 31, a thin-film wiring sheet 181 is firmly fixed by adhesion, for example. On the thin-film wiring sheet 181, electrodes 182 are provided.

The thin-film wiring sheet 181 includes two thin films 181a and 181b of polyimide which constitute a base material to be layer-stacked. The thin-film wiring sheet 181 includes wirings 183 provided on the surface of the thin film 181a that is layer-stacked on the ceramic substrate 31. In the thin film 181a, conductive portions 184, which connect the filling portions 33 and the wirings 183 together, are made to run through. In the thin film 181b that is layer-stacked on the thin film 181a, conductive portions 185, which connect together the wirings 183 and the electrodes 182 provided on the surface of the thin film 181b, are made to run through.

The electrodes 182 make contact with the respective electrodes provided on the surface of the probe head 12 facing thereto.

The structure of the principal surface on the side facing to the interposer 14 (the lower surface in FIG. 10) out of the principal surfaces of the ceramic substrate 31 is the same as that of the space transformer 13 described in the second embodiment. The minimum value of the center-to-center distance of the electrodes 37 is greater than the maximum value of the center-to-center distance of the electrodes 182.

Modification 2-4

Figure 11:
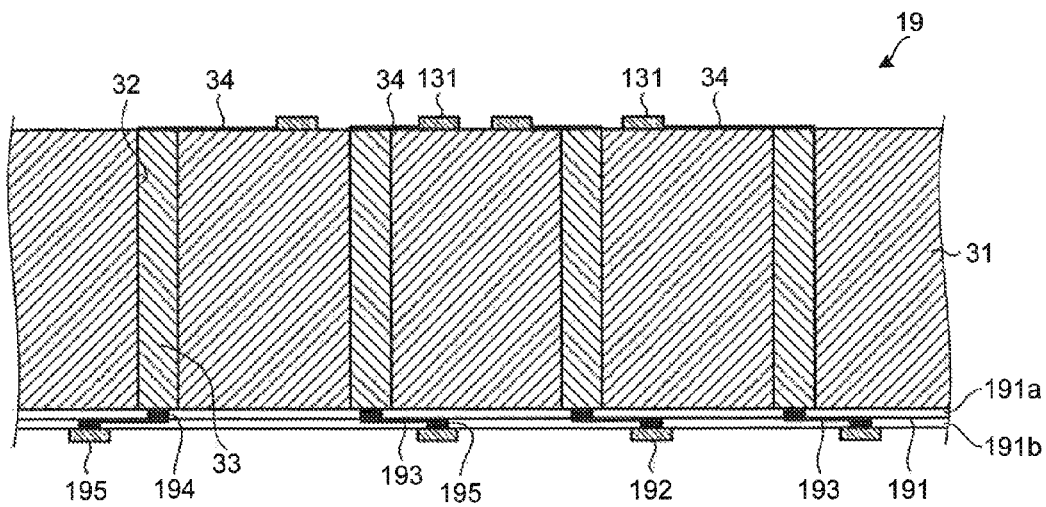
FIG. 11 is a cross-sectional view illustrating the structure of a relevant portion of a space transformer according to a modification 2-4 of the second embodiment of the invention.

FIG. 11 is a cross-sectional view illustrating the structure of a relevant portion of a space transformer according to a modification 2-4 of the second embodiment. A space transformer 19 illustrated in FIG. 11 includes the ceramic substrate 31 as a primary material.

The structure of the principal surface on the side facing to the probe head 12 (the upper surface in FIG. 11) out of the principal surfaces of the ceramic substrate 31 is the same as that of the space transformer 13 described in the second embodiment.

On the principal surface on the side facing to the interposer 14 (the lower surface in FIG. 11) out of the principal surfaces of the ceramic substrate 31, a thin-film wiring sheet 191 is firmly fixed by adhesion, for example. On the thin-film wiring sheet 191, electrodes 192 are provided.

The thin-film wiring sheet 191 includes two thin films 191a and 191b of polyimide which constitute a suitable material to be layer-stacked. The thin-film wiring sheet 191 includes wirings 193 provided on the surface of the thin film 191a that is layer-stacked on the ceramic substrate 31. In the thin film 191a, conductive portions 194, which connect the filling portions 33 and the wirings 193 together, are made to run through. In the thin film 191b that is layer-stacked on the thin film 191a, conductive portions 195, which connect together the wirings 193 and the electrodes 192 provided on the surface of the thin film 191b, are made to run through.

The minimum value of the center-to-center distance of the electrodes 192 is greater than the maximum value of the center-to-center distance of the electrodes 131.

Modification 2-5

Figure 12:
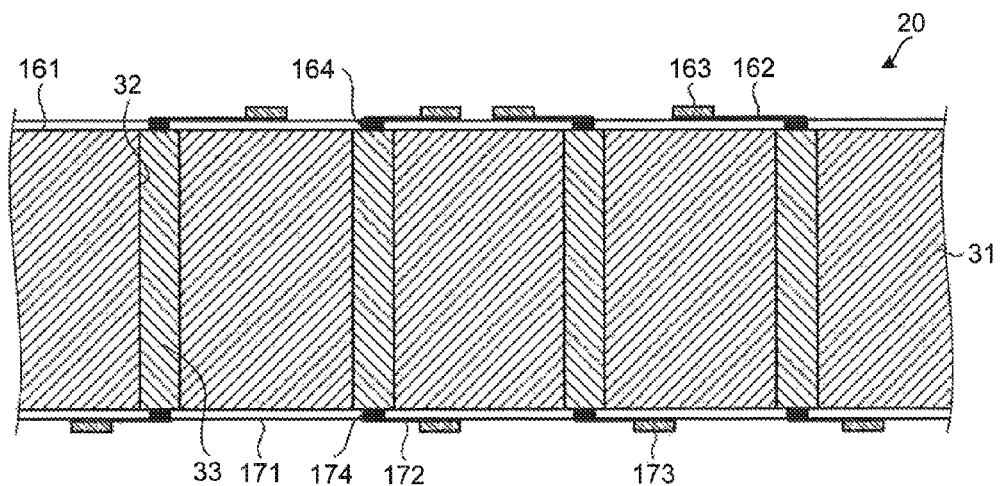
FIG. 12 is a cross-sectional view illustrating the structure of a relevant portion of a space transformer according to a modification 2-5 of the second embodiment of the invention.

FIG. 12 is a cross-sectional view illustrating the structure of a relevant portion of a space transformer according to a modification 2-5 of the second embodiment. A space transformer 20 illustrated in FIG. 12 includes the ceramic substrate 31 as a primary material.

The structure of the principal surface on the side facing to the probe head 12 (the upper surface in FIG. 12) out of the principal surfaces of the ceramic substrate 31 is the same as that of the space transformer 16 described in the modification 2-1. Furthermore, the structure of the principal surface on the side facing to the interposer 14 (the lower surface in FIG. 12) out of the principal surfaces of the ceramic substrate 31 is the same as that of the space transformer 17 described in the modification 2-2. The minimum value of the center-to-center distance of the electrodes 173 is greater than the maximum value of the center-to-center distance of the electrodes 163.

Modification 2-6

Figure 13:
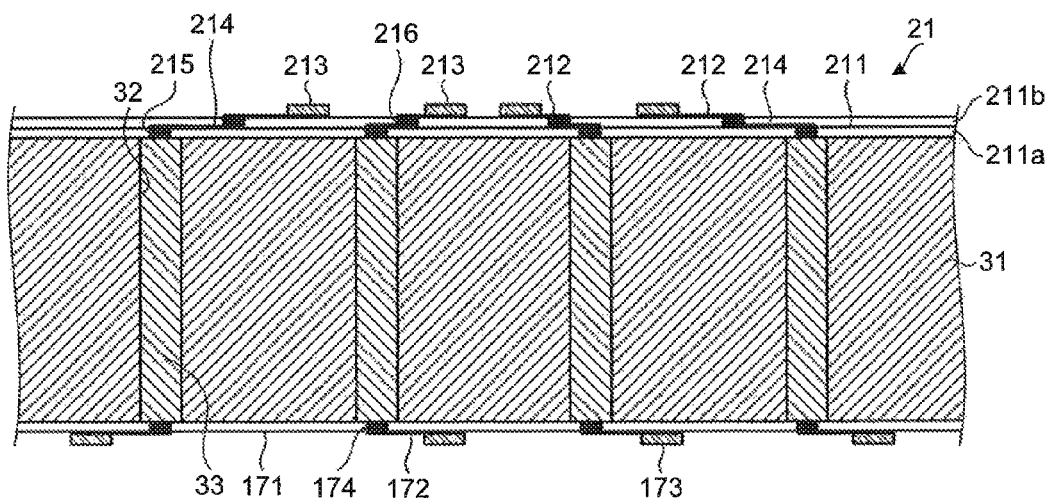
FIG. 13 is a cross-sectional view illustrating the structure of a relevant portion of a space transformer according to a modification 2-6 of the second embodiment of the invention.

FIG. 13 is a cross-sectional view illustrating the structure of a relevant portion of a space transformer according to a modification 2-6 of the second embodiment. A space transformer 21 illustrated in FIG. 13 includes the ceramic substrate 31 as a primary material.

On the principal surface on the side facing to the probe head 12 (the upper surface in FIG. 13) out of the principal surfaces of the ceramic substrate 31, provided are a thin-film wiring sheet 211 firmly fixed by adhesion, for example, wirings 212 provided on the thin-film wiring sheet 211, and electrodes 213 that connect to the wirings 212 on the thin-film wiring sheet 211.

The thin-film wiring sheet 211 includes two thin films 211a and 211b of polyimide which constitute a suitable material to be layer-stacked. The thin-film wiring sheet 211 includes wirings 214 provided on the surface of the thin film 211a that is layer-stacked on the ceramic substrate 31. In the thin film 211a, conductive portions 215, which connect the filling portions 33 and the wirings 214 together, are made to run through. In the thin film 211b that is layer-stacked on the thin film 211a, conductive portions 216, which connect together the wirings 214 and the wirings 212 provided on the surface of the thin film 211b, are made to run through.

The structure of the principal surface on the side facing to the interposer 14 (the lower surface in FIG. 13) out of the principal surfaces of the ceramic substrate 31 is the same as that of the space transformer 17 described in the modification 2-2. The minimum value of the center-to-center distance of the electrodes 173 is greater than the maximum value of the center-to-center distance of the electrodes 213.

Modification 2-7

Figure 14:
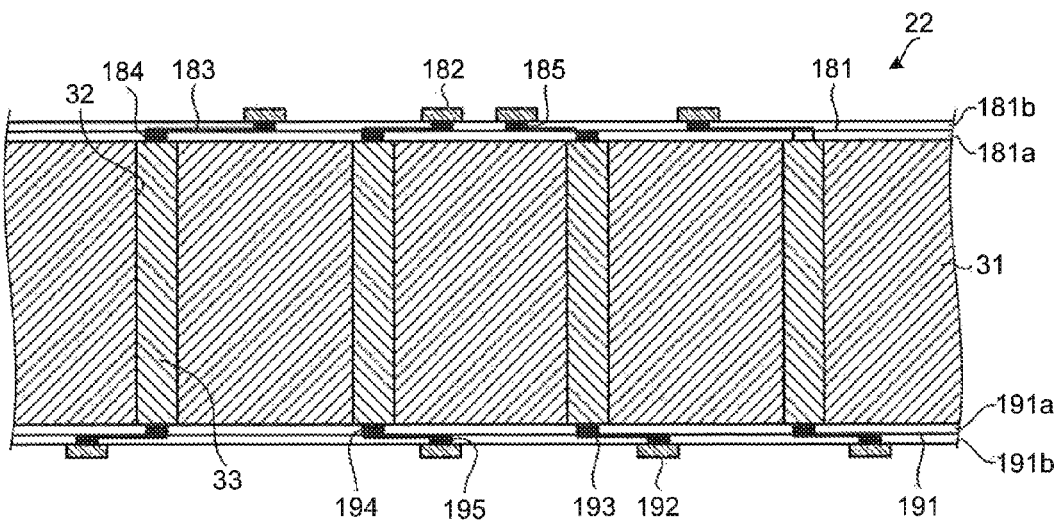
FIG. 14 is a cross-sectional view illustrating the structure of a relevant portion of a space transformer according to a modification 2-7 of the second embodiment of the invention.

FIG. 14 is a cross-sectional view illustrating the structure of a relevant portion of a space transformer according to a modification 2-7 of the second embodiment. A space transformer 22 illustrated in FIG. 14 includes the ceramic substrate 31 as a primary material.

The structure of the principal surface on the side facing to the probe head 12 (the upper surface in FIG. 14) out of the principal surfaces of the ceramic substrate 31 is the same as that of the space transformer 18 described in the modification 2-3. Furthermore, the structure of the principal surface on the side facing to the interposer 14 (the lower surface in FIG. 14) out of the principal surfaces of the ceramic substrate 31 is the same as that of the space transformer 19 described in the modification 2-4. The minimum value of the center-to-center distance of the electrodes 192 is greater than the maximum value of the center-to-center distance of the electrodes 182.

Modification 2-8

Figure 15:
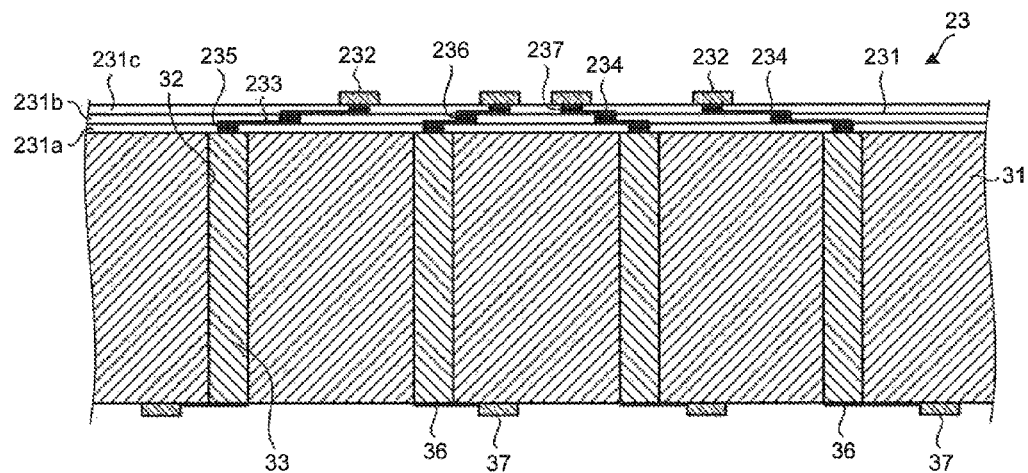
FIG. 15 is a cross-sectional view illustrating the structure of a relevant portion of a space transformer according to a modification 2-8 of the second embodiment of the invention.

FIG. 15 is a cross-sectional view illustrating the structure of a relevant portion of a space transformer according to a modification 2-8 of the second embodiment. A space transformer 23 illustrated in FIG. 15 includes the ceramic substrate 31 as a primary material.

On the principal surface on the side facing to the probe head 12 (the upper surface in FIG. 15) out of the principal surfaces of the ceramic substrate 31, a thin-film multilayer wiring sheet 231 is firmly fixed by adhesion, for example. On the thin-film multilayer wiring sheet 231, electrodes 232 are provided.

The thin-film multilayer wiring sheet 231 includes three thin films 231a, 231b, and 231c of polyimide which are layer-stacked to constitute a base material. The thin-film multilayer wiring sheet 231 includes wirings 233 provided on the surface of the thin film 231a that is layer-stacked on the ceramic substrate 31, and wirings 234 provided on the surface of the thin film 231b that is layer-stacked on the thin film 231a. In the thin film 231a, conductive portions 235 that connect the filling portions 33 and the wirings 233 together are made to run through. In the thin film 231b, conductive portions 236 that connect the wirings 233 and the wirings 234 together are made to run through. In the thin film 231c, conductive portions 237 that connect the electrodes 232 and the wirings 234 together are made to run through.

The structure of the principal surface on the side facing to the interposer 14 (the lower surface in FIG. 15) out of the principal surfaces of the ceramic substrate 31 is the same as that of the space transformer 13 described in the second embodiment. The minimum value of the center-to-center distance of the electrodes 37 is greater than the maximum value of the center-to-center distance of the electrodes 232.

While the thin-film multilayer wiring sheet 231 is formed of two layers of wiring in the modification 2-8, the thin-film multilayer wiring sheet can be constructed by a greater number of layers of wiring.

Naturally, the modifications 2-1 to 2-8 in the foregoing yield the same effects as those of the second embodiment.

Another Embodiment

Figure 16:
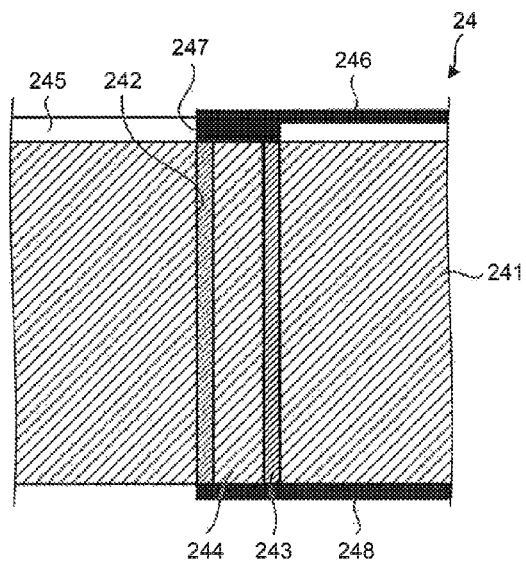
FIG. 16 is a cross-sectional view illustrating the structure of a relevant portion of a space transformer according to another embodiment of the invention.

FIG. 16 is a cross-sectional view illustrating the structure of a relevant portion of a space transformer according to another embodiment of the invention. A space transformer 24 illustrated in FIG. 16 includes, as the same as the ceramic substrate 31, a ceramic substrate 241 as a primary material that contains enstatite and boron nitride as components and is a sintered body in which the boron nitride is oriented in one direction.

In the ceramic substrate 241, a plurality of through holes 242 are formed. On the inner circumferential surface of the through hole 242, plating 243 is made with copper, silver, gold, tin, nickel, and others. In the through hole 242 in which the plating 243 is made, provided is a filling portion 244 filled with insulating material.

On the principal surface on one side (the upper surface in FIG. 16) of the ceramic substrate 241, a thin film sheet 245 is layer-stacked. On the surface of the thin film sheet 245, a wiring 246 is provided. In the thin film sheet 245, a conductive portion 247 that connects the plating 243 and the wiring 246 together is made to run through.

On the principal surface on the other side (the lower surface in FIG. 16) of the ceramic substrate 241, a wiring 248 that connects to the plating 243 is provided.

Note that, in the space transformer 24, the wiring pitches on the two principal surfaces differ from each other naturally.

As in the foregoing, in the invention, the through holes of the space transformer are not necessary to be filled only with conductive material.

As apparent from the above description, the invention includes various other embodiments not explicitly disclosed herein, and a variety of design changes and modifications can be devised without departing from the scope of technical idea defined by the claims.

EXAMPLES

Examples of the present invention will now be described. Note that the following description of examples are not intended to limit the scope of the invention.

In each of the examples of the invention, a sintered body of 90 millimeters long, 90 millimeters wide, and 20 millimeters thick was fired using a given material lot. In the firing, the causing the external force to act and the sintering were performed collectively by the hot-press sintering method.

Figure 17:
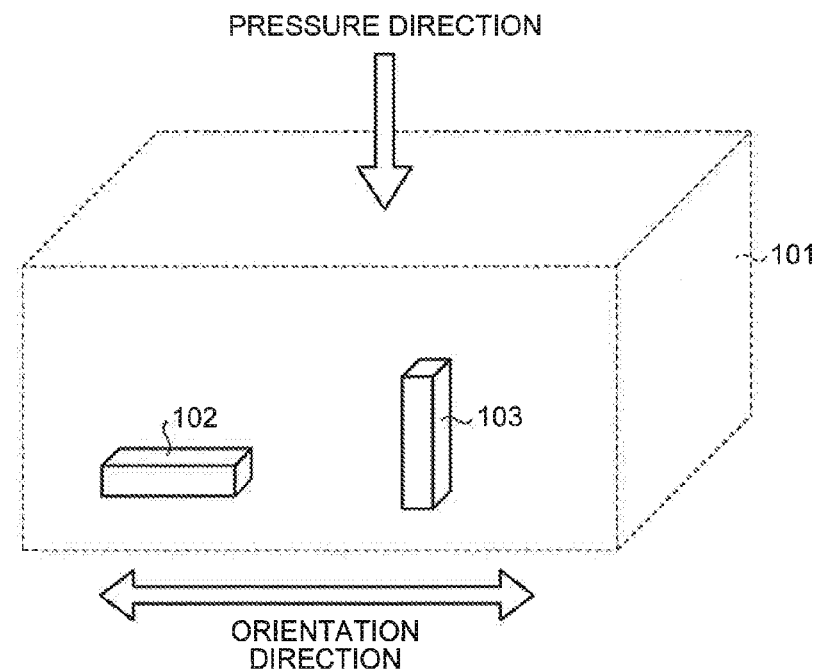
FIG. 17 is a diagram illustrating specimens used for the measurement of thermal expansion coefficient in examples of the invention.
Figure 18:
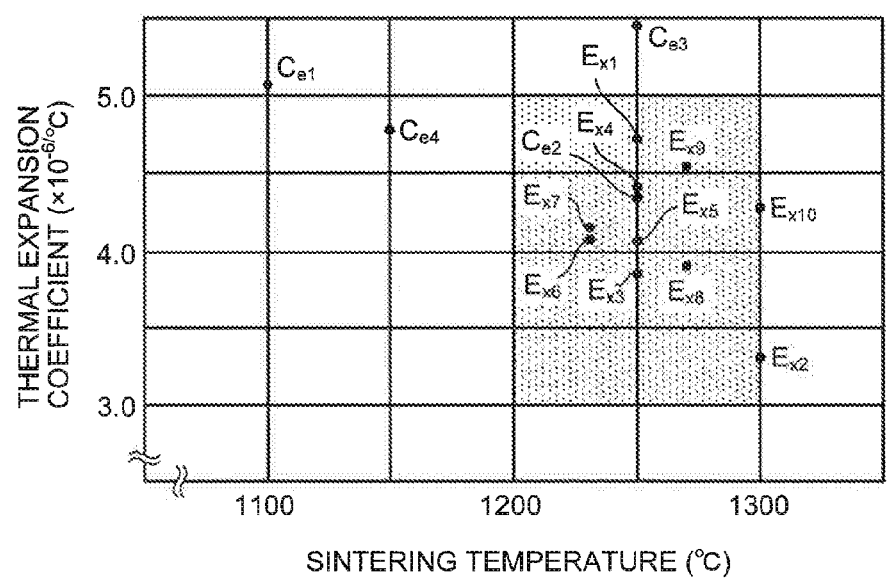
FIG. 18 is a chart illustrating the relation between the measured thermal expansion coefficient and sintering temperature in the examples of the invention.
Figure 19:
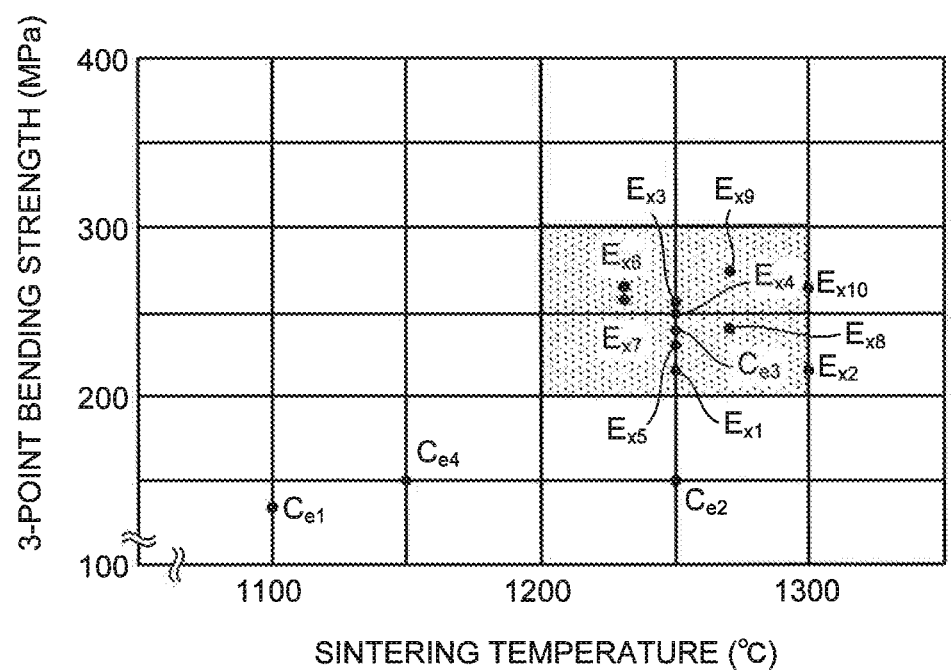
FIG. 19 is a chart illustrating the relation between the measured three-point bending strength and sintering temperature in the examples of the invention.

FIG. 17 is a view schematically illustrating specimens used for measurement in the present examples. Specifically, FIG. 17 schematically illustrates how to cut out specimens from a sintered body 101 (indicated by a dashed line). FIG. 18 is a chart illustrating the relation between the thermal expansion coefficient measured using specimens and sintering temperature. FIG. 19 is a chart illustrating the relation between the three-point bending strength measured using specimens and sintering temperature.

Among two specimens 102 and 103 illustrated in FIG. 17, the specimen 102 was fabricated for measuring thermal expansion in the direction in which the boron nitride is orientated, and the specimen 103 was fabricated for measuring thermal expansion in the pressure direction (perpendicular to the orientation direction). By using the specimen 102 cut out in this manner, the coefficient of thermal expansion ($\times 10^{-6}/°$ C.) was measured in conformity with JIS R 1618, and the three-point bending strength based on JIS R 1601 was measured. The results thereof are listed in Table 1 together with material lot number of raw materials, respective content rates (% by weight) of raw materials and sintering additives, sintering temperature (° C.), sintering pressure (MPa), presence of components included in the fired ceramic member, thermal expansion coefficient, bending strength, orientation, orientation index, and relative density. In Table 1, the material lot number is a number representing the difference in material lot used for firing the ceramic substrates.

| Material Lot | Raw materials (wt %) | | | Sintering additives (wt %) | | | Sintering temperature (° C.) | Sintering pressure (MPa) | Components | | | Thermal expansion coefficient 2MgO ·SiO$_2$ (×10$^{-6}$/° C.) | Bending strength (MPa) | Orientation (I.O.P) | Orientation index | Relative density % |
|---|---|---|---|---|---|---|---|---|---|---|---|---|---|---|---|---|
| | BN | SiO$_2$ | MgO | Y$_2$O$_3$ | Al$_2$O$_3$ | Total | | | MgSiO$_3$ | BN | | | | | | |
| Example 1 | L1 | 49.3 | 24.8 | 19.6 | 4.7 | 1.6 | 100 | 1250 | 25 | ○ | ○ | ○ | 4.7 | 216 | 0.15 | 0.83 | 99.9 |
| Example 2 | L2 | 49.3 | 24.8 | 19.6 | 4.7 | 1.6 | 100 | 1300 | 25 | ○ | ○ | ○ | 3.3 | 216 | 0.04 | 1.38 | 99.6 |
| Example 3 | L3 | 49.3 | 24.8 | 19.6 | 4.7 | 1.6 | 100 | 1250 | 35 | ○ | ○ | — | 3.8 | 252 | 0.10 | 0.99 | 99.9 |
| Example 4 | L3 | 49.3 | 24.8 | 19.6 | 4.7 | 1.6 | 100 | 1250 | 25 | ○ | ○ | ○ | 4.3 | 243 | 0.13 | 0.87 | 99.6 |
| Example 5 | L4 | 49.3 | 24.8 | 19.6 | 4.7 | 1.6 | 100 | 1250 | 25 | ○ | ○ | — | 4.1 | 234 | 0.13 | 0.88 | 99.6 |
| Example 6 | L3 | 49.3 | 24.8 | 19.6 | 4.7 | 1.6 | 100 | 1230 | 25 | ○ | ○ | — | 4.1 | 243 | 0.12 | 0.33 | 99.9 |
| Example 7 | L4 | 49.3 | 24.8 | 19.6 | 4.7 | 1.6 | 100 | 1230 | 25 | ○ | ○ | — | 4.1 | 246 | 0.13 | 0.90 | 99.9 |
| Example 8 | L4 | 49.3 | 24.8 | 19.6 | 4.7 | 1.6 | 100 | 1270 | 25 | ○ | ○ | — | 3.9 | 239 | 0.12 | 0.91 | 99.2 |
| Example 9 | L5 | 49.3 | 24.8 | 19.6 | 4.7 | 1.6 | 100 | 1270 | 25 | ○ | ○ | ○ | 4.5 | 275 | 0.13 | 0.87 | 99.8 |
| Example 10 | L5 | 49.3 | 24.8 | 19.6 | 4.7 | 1.6 | 100 | 1300 | 25 | ○ | ○ | ○ | 4.3 | 265 | 0.12 | 0.93 | 99.9 |
| Comparative Example 1 | L6 | 49.3 | 24.8 | 19.6 | 4.7 | 1.6 | 100 | 1100 | 25 | ○ | ○ | ○ | 5.1 | 138 | 0.10 | 1.36 | 93.3 |
| Comparative Example 2 | L6 | 49.3 | 24.8 | 19.6 | 4.7 | 1.6 | 100 | 1250 | 10 | ○ | ○ | ○ | 4.4 | 153 | 0.19 | 0.72 | 86.2 |
| Comparative Example 3 | L7 | 49.3 | 18.9 | 25.5 | 4.7 | 1.6 | 100 | 1250 | 25 | ○ | ○ | — | 5.5 | 240 | 0.10 | 1.01 | 99.9 |
| Comparative Example 4 | L1 | 49.3 | 24.8 | 19.6 | 4.7 | 1.6 | 100 | 1150 | 25 | ○ | ○ | ○ | 4.8 | 149 | 0.07 | 1.14 | 99.6 |

Example 1

In Example 1 of the invention, using the material lot L1, a sintered body of 90 millimeters long, 90 millimeters wide, and 20 millimeters thick was fired using boron nitride (BN) at 49.3 (% by weight), silicon oxide (SiO$_2$) at 24.8 (% by weight), and magnesium oxide (MgO) at 19.6 as raw materials, and yttrium oxide (Y$_2$O$_3$) at 4.7 (% by weight) and aluminum oxide (Al$_2$O$_3$) at 1.6 (% by weight) as sintering additives. In firing, the processes of applying external force and sintering were performed collectively by the hot-press sintering method. In the hot-press sintering, pressing was performed in one direction with a sintering pressure of 25 megapascals contact pressure in a nitrogen atmosphere of 600 mmHg, and sintering was performed at a temperature of 1250° C. for two hours. After the firing, the sintered ceramic member was analyzed by X-ray diffraction for the presence of components included therein. In FIGS. 18 and 19, the points E$_{x1}$ represent the measured results of Example 1.

As listed in Table 1, the ceramic member (Material Lot: L1) in Example 1 contains enstatite (MgSiO$_3$), boron nitride (BN), and forsterite (2MgO.SiO$_2$) as components, and the thermal expansion coefficient in the orientation direction at a temperature of 150° C. was 4.7×10$^{-6}$/° C., and the three-point bending strength was 216 megapascals.

Furthermore, for the two types of specimens 102 and 103 cut out from the ceramic member of Example 1, the thermal expansion coefficients in the orientation direction and in the pressure direction were measured in predetermined temperature zones between 20 to 250° C. Table 2 is a table illustrating the relation of the thermal expansion coefficients in orientation direction and the thermal expansion coefficients in pressure direction, which were measured using the specimens in the predetermined temperature zones between 20 and 250° C., with respect to the temperature.

TABLE 2

| Temperature (° C.) | Thermal Expansion Coefficient (×10$^{-6}$/° C.) | |
|---|---|---|
| | Orientation Direction | Pressure Direction |
| 20 to 100 | 4.6 | 6.2 |
| to 150 | 4.7 | 6.3 |
| to 200 | 4.9 | 6.4 |
| to 250 | 5.0 | 6.6 |

Table 2 indicates that the coefficient of thermal expansion of the ceramic member in the direction of orientation was approximately 4.6×10$^{-6}$/° C. to 5.0×10$^{-6}$/° C. in all of the temperature zones of 20 to 250° C., and achieved values close to the coefficient of thermal expansion of silicon (3.4×10$^{-6}$/° C.). By contrast, the coefficient of thermal expansion in a direction parallel to the pressure direction was approximately 6.2×10$^{-6}$/° C. to 6.6×10$^{-6}$/° C. As a result, it was obvious that anisotropy related to the coefficient of thermal expansion occurred in the ceramic member according to Example 1.

To further ascertain the orientation of the above-described boron nitride particles, X-ray diffraction was performed using the fired ceramic member in Example 1, and from the measurement result, the orientation (I.O.P.) and the orientation index of boron nitride were obtained. Table 1 lists the respective values of the orientation (I.O.P.) and the orientation index of boron nitride.

As listed in Table 1, because the fired ceramic member has the orientation of I.O.P.=0.15<1, it can tell that the c-axis of the boron nitride crystal in the specimen is oriented in parallel with the pressure direction and the scaly surface of the boron nitride crystal is oriented along the plate surface direction of the fired ceramic member.

Furthermore, the relative density (bulk density) of the fired ceramic member was measured to be 99.9%, and thus the fired ceramic member was found to be a dense sintered body.

To confirm the processability of the ceramic member, a ceramic member with a through-thickness of 2.70 millimeters was formed from the sintered body in Example 1, and 500 through holes were formed in the ceramic member in a matrix manner by drilling with a carbide drill. Here, the diameter of the through hole was 160 μm (the aspect ratio was 2.70/0.160=16.9), and the hole pitch was 200 μm. This successfully achieved pitch accuracy within plus/minus several micrometers. In this sense, it was also confirmed that the ceramic member manufactured in Example 1 had excellent processability.

Example 2

In Example 2 of the invention, using the material lot L2, a sintered body of 90 millimeters long, 90 millimeters wide, and 5 millimeters thick was fired by the method in Example 1 with the sintering temperature changed to 1300° C. After the firing, presence of each component included in the ceramic member thus sintered was analyzed by the X-ray diffraction in the same manner as in Example 1. The results thereof are listed in Table 1 together with the respective content rates (% by weight) of raw materials and sintering additives, sintering temperature (° C.), and sintering pressure (MPa) used in Example 2, and the presence of components included in the fired ceramic member.

Then, a specimen corresponding to the specimen 102 of Example 1 was cut out from the fired ceramic member, and the thermal expansion coefficient ($\times 10^{-6}$/° C.) conforming to JIS R 1618 and the three-point bending strength based on JIS R 1601 were measured. In addition, X-ray diffraction was measured using the fired ceramic member in Example 2, and the orientation (I.O.P.) and orientation index of boron nitride were obtained from the measurement result. Table 1 lists the respective values of thermal expansion coefficient, three-point bending strength, and orientation (I.O.P.) and orientation index of boron nitride as well. Table 1 further includes the measured value of relative density (bulk density) of the fired ceramic member. Moreover, the point $E_{x2}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 2 included at least boron nitride and enstatite as components, had a coefficient of thermal expansion in a direction parallel to the direction of orientation of $3.3 \times 10^{-6}$/° C. at a temperature of 150° C., and had three-point bending strength of 216 MPa. Furthermore, the orientation was I.O.P.=0.04, the orientation index was 1.38, and the relative density was 99.6%, and thus it was found that the boron nitride crystal is oriented along the plate surface of the ceramic member and the ceramic member is a dense sintered body.

Through holes were formed in the ceramic member in the same manner as in Example 1 to confirm the processability of the ceramic member. As a result, it was confirmed that the ceramic member manufactured in Example 2 had the processability equivalent to that of the ceramic member manufactured in Example 1.

Example 3

In Example 3 of the invention, using material lot L3, a ceramic member was fired in the same manner as in Example 2 except for changing the sintering temperature to 1250° C. and changing the sintering pressure to 35 megapascals, and the analysis and measurement were performed in the same manner as in Example 2 on the fired ceramic member and on the specimen cut out therefrom. The results thereof are listed in Table 1 together with the respective content rates of raw materials and others. In addition, the point $E_{x3}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 3 included boron nitride and enstatite as components, had coefficient of thermal expansion of $3.8 \times 10^{-6}$/° C. in a direction parallel to the direction of orientation, and had three-point bending strength of 252 MPa. Furthermore, the orientation was I.O.P.=0.10, the orientation index was 0.99, and the relative density was 99.9%, and thus it was found that the boron nitride crystal is oriented along the plate surface of the ceramic member and the ceramic member is a dense sintered body.

Through holes were formed in the same manner as in Example 2 to confirm the processability of the ceramic member. As a result, it was confirmed that the ceramic member manufactured in Example 3 had the processability equivalent to that of the ceramic member manufactured in Example 1.

Example 4

In Example 4 of the invention, using material lot L3, a ceramic member was fired in the same manner as in Example 2 except for changing the sintering temperature to 1250° C., and the analysis and measurement were performed in the same manner as in Example 2 on the fired ceramic member and on the specimen cut out therefrom. The results thereof are listed in Table 1 together with the respective content rates of raw materials and others. In addition, the point $E_{x4}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 4 included at least boron nitride and enstatite as components, had coefficient of thermal expansion of $4.3 \times 10^{-6}$/° C. in a direction parallel to the direction of orientation, and had three-point bending strength of 249 MPa. Furthermore, the orientation was I.O.P.=0.13, the orientation index was 0.87, and the relative density was 99.6%, and thus it was found that the boron nitride crystal is oriented along the plate surface of the ceramic member and the ceramic member is a dense sintered body.

Through holes were formed in the same manner as in Example 2 to confirm the processability of the ceramic member. As a result, it was confirmed that the ceramic member manufactured in Example 4 had the processability equivalent to that of the ceramic member manufactured in Example 1.

Example 5

In Example 5 of the invention, using material lot L4, a ceramic member was fired in the same manner as in Example 2 except for changing the sintering temperature to 1250° C., and the analysis and measurement were performed in the same manner as in Example 2 on the fired ceramic member and on the specimen cut out therefrom. The results thereof are listed in Table 1 together with the respective content rates of raw materials and others. In addition, the point $E_{x5}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 5 included boron nitride and enstatite as components, had coefficient of thermal expansion of $4.1\times10^{-6}$/C in a direction parallel to the direction of orientation, and had three-point bending strength of 234 MPa. Furthermore, the orientation was I.O.P.=0.13, the orientation index was 0.88, and the relative density was 99.6%, and thus it was found that the boron nitride crystal is oriented along the plate surface of the ceramic member and the ceramic member is a dense sintered body.

Through holes were formed in the same manner as in Example 2 to confirm the processability of the ceramic member. As a result, it was confirmed that the ceramic member manufactured in Example 5 had the processability equivalent to that of the ceramic member manufactured in Example 1.

Example 6

In Example 6 of the invention, using material lot L3, a ceramic member was fired in the same manner as in Example 2 except for changing the sintering temperature to 1230° C., and the analysis and measurement were performed in the same manner as in Example 2 on the fired ceramic member and on the specimen cut out therefrom. The results thereof are listed in Table 1 together with the respective content rates of raw materials and others. In addition, the point $E_{x6}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 6 included boron nitride and enstatite as components, had coefficient of thermal expansion $4.1\times10^{-6}$/° C. in a direction parallel to the direction of orientation of, and had three-point bending strength of 249 MPa. Furthermore, the orientation was I.O.P.=0.12, the orientation index was 0.93, and the relative density was 99.9%, and thus it was found that the boron nitride crystal is oriented along the plate surface of the ceramic member and the ceramic member is a dense sintered body.

Through holes were formed in the same manner as in Example 2 to confirm the processability of the ceramic member. As a result, it was confirmed that the ceramic member manufactured in Example 6 had the processability equivalent to that of the ceramic member manufactured in Example 1.

Example 7

In Example 7 of the invention, using material lot L4, a ceramic member was fired in the same manner as in Example 2 except for changing the sintering temperature to 1230° C., and the analysis and measurement were performed in the same manner as in Example 2 on the fired ceramic member and on the specimen cut out therefrom. The results thereof are listed in Table 1 together with the respective content rates of raw materials and others. In addition, the point $E_{x7}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 7 included boron nitride and enstatite as components, had coefficient of thermal expansion of $4.1\times10^{-6}$/° C. in a direction parallel to the direction of orientation, and had three-point bending strength of 246 MPa. Furthermore, the orientation was I.O.P.=0.13, the orientation index was 0.90, and the relative density was 99.9%, and thus it was found that the boron nitride crystal is oriented along the plate surface of the ceramic member and the ceramic member is a dense sintered body.

Through holes were formed in the same manner as in Example 2 to confirm the processability of the ceramic member. As a result, it was confirmed that the ceramic member manufactured in Example 7 had the processability equivalent to that of the ceramic member manufactured in Example 1.

Example 8

In Example 8 of the invention, using material lot L4, a ceramic member was fired in the same manner as in Example 2 except for changing the sintering temperature to 1270° C., and the analysis and measurement were performed in the same manner as in Example 2 on the fired ceramic member and on the specimen cut out therefrom. The results thereof are listed in Table 1 together with the respective content rates of raw materials and others. In addition, the point $E_{x8}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 8 included boron nitride and enstatite as components, had coefficient of thermal expansion of $3.9\times10^{-6}$/° C. in a direction parallel to the direction of orientation, and had three-point bending strength of 239 MPa. Furthermore, the orientation was I.O.P.=0.12, the orientation index was 0.91, and the relative density was 99.2%, and thus it was found that the boron nitride crystal is oriented along the plate surface of the ceramic member and the ceramic member is a dense sintered body.

Through holes were formed in the same manner as in Example 2 to confirm the processability of the ceramic member. As a result, it was confirmed that the ceramic member manufactured in Example 8 had the processability equivalent to that of the ceramic member manufactured in Example 1.

Example 9

In Example 9 of the invention, using material lot L5, a ceramic member was fired in the same manner as in Example 2 except for changing the sintering temperature to 1270° C., and the analysis and measurement were performed in the same manner as in Example 2 on the fired ceramic member and on the specimen cut out therefrom. The results thereof are listed in Table 1 together with the respective content rates of raw materials and others. In addition, the point $E_{x9}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 9 included at least boron nitride and enstatite as components, had coefficient of thermal expansion of $4.5\times10^{-6}$/C in a direction parallel to the direction of orientation, and had three-point bending strength of 275 MPa. Furthermore, the orientation was I.O.P.=0.13, the orientation index was 0.87, and the relative density was 99.8%, and thus it was found that the boron nitride crystal is oriented along the plate surface of the ceramic member and the ceramic member is a dense sintered body.

Through holes were formed in the same manner as in Example 2 to confirm the processability of the ceramic member. As a result, it was confirmed that the ceramic member manufactured in Example 9 had the processability equivalent to that of the ceramic member manufactured in Example 1.

Example 10

In Example 10 of the invention, using material lot L5, a ceramic member was fired in the same manner as in Example 2 except for changing the sintering temperature to 1300° C., and the analysis and measurement were performed in the same manner as in Example 2 on the fired ceramic member and on the specimen cut out therefrom. The results thereof are listed in Table 1 together with the respective content rates of raw materials and others. In addition, the point $E_{x10}$ in FIG. 18 represents the relation of the measured thermal expansion coefficient and the sintering temperature, and that in FIG. 19 represents the relation of the measured three-point bending strength and the sintering temperature.

As listed in Table 1, the ceramic member of Example 10 included at least boron nitride and enstatite as components, had coefficient of thermal expansion of $4.3 \times 10^{-6}/°$ C. in a direction parallel to the direction of orientation, and had three-point bending strength of 265 MPa. Furthermore, the orientation was I.O.P.=0.12, the orientation index was 0.93, and the relative density was 99.9%, and thus it was found that the boron nitride crystal is oriented along the plate surface of the ceramic member and the ceramic member is a dense sintered body.

Through holes were formed in the same manner as in Example 2 to confirm the processability of the ceramic member. As a result, it was confirmed that the ceramic member manufactured in Example 10 had the processability equivalent to that of the ceramic member manufactured in Example 1.

Comparative Examples 1 to 4

For comparison, ceramic members in Comparative Examples 1 to 4 were fired by varying the respective content rates (% by weight) of raw materials and sintering additives, sintering temperature (° C.), and sintering pressure (MPa). Then, for the fired ceramic members and the specimens cut out therefrom, the presence of components included, thermal expansion coefficient, three-point bending strength, orientation, orientation index, and relative density (bulk density) were measured in the same manner as in Examples 1 to 10. The results thereof are listed in Table 1 together with the content rates (% by weight) of raw materials, content rates (% by weight) of sintering additives, sintering temperature (° C.), and sintering pressure (MPa) used in Comparative Examples 1 to 4. Furthermore, the points $C_{e1}$ to $C_{e4}$ in FIG. 18 represent the respective relations of the measured thermal expansion coefficient and the sintering temperature, and those in FIG. 19 represent the respective relations of the measured three-point bending strength and the sintering temperature.

As listed in Table 1, the ceramic members in Comparative Examples 1 to 4 include at least boron nitride and enstatite. However, the ceramic members in Comparative Examples 1 to 4 were one with a thermal expansion coefficient outside the range of $3 \times 10^{-6}$ to $5 \times 10^{-6}/°$ C. and with a three-point bending strength outside the range of 200 to 300 megapascals (Comparative Example 1), one with a thermal expansion coefficient outside the range of $3 \times 10^{-6}$ to $5 \times 10^{-6}/°$ C. (Comparative Example 3), and ones with a three-point bending strength outside the range of 200 to 300 megapascals (Comparative Examples 2 and 4).

INDUSTRIAL APPLICABILITY

As in the foregoing, the space transformer according to the invention and a probe card provided with the space transformer have a thermal expansion coefficient close to that of silicon and are simple in structure, and thus are useful for enlarging the diameter thereof.

REFERENCE SIGNS LIST 1, 11 probe card
2 probe
3, 8, 13, 16, 17, 18, 19, 20, 21, 22, 23, 24 space transformer
4 interconnect substrate
5 plate spring
6 connector
7 reinforcing member
12 probe head
14 interposer
31, 241 ceramic substrate
32, 242 through hole
33, 244 filling portion
34, 36, 83, 84, 162, 172, 183, 193, 212, 214, 233, 234, 246, 248 wiring
35, 37, 82, 131, 163, 173, 182, 192, 213, 232 electrode
81, 231 thin-film multilayer wiring sheet
81a, 81b, 81c, 181a, 181b, 191a, 191b, 211a, 211b, 231a, 231b, 231c thin film
85, 86, 87, 164, 174, 184, 185, 194, 195, 215, 216, 235, 236, 237, 247 conductive portion
101 sintered body
102, 103 specimen
161, 171, 245 thin film sheet
181, 191, 211 thin-film wiring sheet
243 plating

The invention claimed is:

1. A space transformer comprising:
a ceramic substrate that contains enstatite and boron nitride as components;
a through hole running through in a thickness direction with respect to a sintered body in which the boron nitride is oriented in one direction;
conductive material provided inside the through hole; and
a wiring patterns including a plurality of electrodes provided on each of two principal surfaces of the ceramic substrate, wherein a wiring pitch in the wiring pattern on one principal surface is different from a wiring pitch in the wiring pattern on the other principal surface,
wherein the ceramic substrate has an orientation index $K=|\log_{10}\{(I_{(100)}/I_{(002)})///(I_{(100)}/I_{(002)})\bot\}|$ equal to or higher than 0.8 that is calculated based on a ratio $(I_{(100)}/I_{(002)})//$ between intensity of X-ray diffraction $I_{(002)}$ along a (002) plane of a crystal of the boron nitride and intensity of X-ray diffraction $I_{(100)}$ along a (100) plane thereof when irradiated with an X-ray in the orientation direction of the boron nitride and a ratio $(I_{(100)}/I_{(002)})\bot$ between the intensity of X-ray diffraction $I_{(002)}$ along the (002) plane and the intensity of X-ray diffraction $I_{(100)}$ along the (100) plane when irradiated with an X-ray in a direction orthogonal to the orientation direction.

2. The space transformer according to claim 1, further comprising a thin film of polyimide stacked and firmly fixed on at least one principal surface of the ceramic substrate, and
wherein the wiring pattern is provided inside or on a surface of the thin film.

3. The space transformer according to claim 1, wherein the ceramic substrate has a thermal expansion coefficient of $3 \times 10^{-6}$ to $5 \times 10^{-6}/°$ C. that is the measured thermal expansion coefficient based on JIS R 1618 and is the thermal expansion coefficient in a direction parallel to the direction the boron nitride is oriented at temperatures between 20 and 250° C.

4. The space transformer according to claim 1, wherein the ceramic substrate has a three-point bending strength equal to or greater than 200 megapascals that is measured based on JIS R 1601.

5. The space transformer according to claim 1, wherein the ceramic substrate has a relative density equal to or greater than 99%.

6. The space transformer according to claim 1, wherein the ceramic substrate contains the boron nitride in a hexagonal crystal structure and of scaly particles.

7. A probe card comprising:
a space transformer comprising:
   a ceramic substrate that contains enstatite and boron nitride as components;
   a through hole running through in a thickness direction with respect to a sintered body in which the boron nitride is oriented in one direction;
   conductive material provided inside the through hole; and
   a wiring patterns including a plurality of electrodes provided on each of two principal surfaces of the ceramic substrate, wherein a wiring pitch in the wiring pattern on one principal surface is different from a wiring pitch in the wiring pattern on the other principal surface;
a plurality of probes formed of conductive material, and firmly fixed to each of a plurality of electrodes provided on one principal surface side of the ceramic substrate on which a wiring pitch is smaller than that on another principal surface side; and
an interconnect substrate layer-stacked on the other principal surface side of the ceramic substrate,
wherein the ceramic substrate has an orientation index $K=|\log_{10}\{(I_{(100)}/I_{(002)})///(I_{(100)}/I_{(002)})\perp\}|$ equal to or higher than 0.8 that is calculated based on a ratio $(I_{(100)}/I_{(002)})//$ between intensity of X-ray diffraction $I_{(002)}$ along a (002) plane of a crystal of the boron nitride and intensity of X-ray diffraction $I_{(100)}$ along a (100) plane thereof when irradiated with an X-ray in the orientation direction of the boron nitride and a ratio $(I_{(100)}/I_{(002)})\perp$ between the intensity of X-ray diffraction $I_{(002)}$ along the (002) plane and the intensity of X-ray diffraction $I_{(100)}$ along the (100) plane when irradiated with an X-ray in a direction orthogonal to the orientation direction.

8. The probe card according to claim 7, further comprising a base material formed of a thin film of polyimide in a single layer or multiple layers, and
wherein the wiring pattern on the principal surface side onto which the probes are firmly fixed is formed inside the base material.

9. A probe card comprising:
a space transformer comprising:
   a ceramic substrate that contains enstatite and boron nitride as components;
   a through hole running through in a thickness direction with respect to a sintered body in which the boron nitride is oriented in one direction;
   conductive material provided inside the through hole; and
   a wiring patterns including a plurality of electrodes provided on each of two principal surfaces of the ceramic substrate, wherein a wiring pitch in the wiring pattern on one principal surface is different from a wiring pitch in the wiring pattern on the other principal surface;
a plurality of probes formed of conductive material;
a probe head that holds the probes and is layer-stacked on the principal surface of the space transformer on one side on which a pitch between the electrodes is relatively small; and
an interconnect substrate layer-stacked on the principal surface of the space transformer on a side different from the principal surface on which the probe head is layer-stacked,
wherein the ceramic substrate has an orientation index $K=|\log_{10}\{(I_{(100)}/I_{(002)})///(I_{(100)}/I_{(002)})\perp\}|$ equal to or higher than 0.8 that is calculated based on a ratio $(I_{(100)}/I_{(002)})//$ between intensity of X-ray diffraction $I_{(002)}$ along a (002) plane of a crystal of the boron nitride and intensity of X-ray diffraction $I_{(100)}$ along a (100) plane thereof when irradiated with an X-ray in the orientation direction of the boron nitride and a ratio $(I_{(100)}/I_{(002)})\perp$ between the intensity of X-ray diffraction $I_{(002)}$ along the (002) plane and the intensity of X-ray diffraction $I_{(100)}$ along the (100) plane when irradiated with an X-ray in a direction orthogonal to the orientation direction.

* * * * *